(12) United States Patent
Zhang et al.

(10) Patent No.: US 10,128,801 B2
(45) Date of Patent: Nov. 13, 2018

(54) BOOTSTRAPPING READOUT FOR LARGE TERMINAL CAPACITANCE ANALOG-SIPM BASED TIME-OF-FLIGHT PET DETECTOR

(71) Applicant: Siemens Medical Solutions USA, Inc., Malvern, PA (US)

(72) Inventors: Nan Zhang, Knoxville, TN (US); Matthias J. Schmand, Lenoir City, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 359 days.

(21) Appl. No.: 15/149,303

(22) Filed: May 9, 2016

(65) Prior Publication Data

US 2016/0327657 A1    Nov. 10, 2016

Related U.S. Application Data

(60) Provisional application No. 62/158,108, filed on May 7, 2015.

(51) Int. Cl.

| | |
|---|---|
| H03F 1/34 | (2006.01) |
| H03F 3/19 | (2006.01) |
| G01T 1/20 | (2006.01) |
| G01T 1/208 | (2006.01) |
| H03F 3/45 | (2006.01) |

(52) U.S. Cl.
CPC ............... *H03F 1/34* (2013.01); *G01T 1/208* (2013.01); *G01T 1/2018* (2013.01); *H03F 3/19* (2013.01); *H03F 3/45475* (2013.01); *H03F 2200/222* (2013.01); *H03F 2200/451* (2013.01); *H03F 2203/45151* (2013.01); *H03F 2203/45172* (2013.01); *H03F 2203/45288* (2013.01); *H03F 2203/45621* (2013.01)

(58) Field of Classification Search
CPC ......... G01T 1/208; G01T 1/2018; H03F 1/34; H03F 3/45475; H03F 3/19
See application file for complete search history.

(56) References Cited

U.S. PATENT DOCUMENTS

| | | | | |
|---|---|---|---|---|
| 8,884,220 | B2 * | 11/2014 | Hoyes | ................... H01J 49/025 |
| | | | | 250/281 |
| 2011/0108702 | A1 * | 5/2011 | Jackson | .............. H01L 27/1446 |
| | | | | 250/207 |

OTHER PUBLICATIONS

Cova, S., et al. "Avalanche photodiodes and quenching circuits for single-photon detection." Applied optics 35.12 (1996): 1956-1976.
(Continued)

*Primary Examiner* — Hugh H Maupin (57) ABSTRACT

A detector system for time-of-flight (TOF) positron emission topography (PET) includes an analog silicon photomultiplier (aSiPM) configured to detect at least one photon event. The aSiPM has an anode and a cathode. A transformer has a first side electrically coupled to the aSiPM to form a low-impedance current loop between the anode and the cathode of the transformer. An impedance ratio of the transformer N reduces an effective terminal resistance of the aSiPM. An amplifier is electrically coupled to a second side of the transformer. The amplifier has negative feedback path configured to minimize the voltage swing between a non-inverting input and an inverting input. The negative feedback path reduces an effective terminal capacitance and an effective load impedance of the aSiPM.

20 Claims, 5 Drawing Sheets

(56) References Cited

OTHER PUBLICATIONS

Corsi, F., et al. "Modelling a silicon photomultiplier (SiPM) as a signal source for optimum front-end design." Nuclear Instruments and Methods in Physics Research Section A: Accelerators, Spectrometers, Detectors and Associated Equipment 572.1 (2007): 416-418.

Derenzo, Stephen E., Woon-Seng Choong, and William W. Moses, "Fundamental limits of scintillation detector timing precision.", Physics in medicine and biology 59.13 (2014): 3261.

Shao, Yiping. "A new timing model for calculating the intrinsic timing resolution of a scintillator detector." Physics in medicine and biology 52.4 (2007): 1103.

Seifert, Stefan, et al. "A comprehensive model to predict the timing resolution of SiPM-based scintillation detectors: theory and experimental validation", IEEE Transactions on Nuclear Science 59.1 (2012): 190-204.

Abdullah, M. F. L., and R. J. Green. "Noise analysis adjustable bootstrap transimpedance and voltage feedback receiver amplifier." Journal of Applied Sciences 11 (2011): 3775-3782.

Hoyle, C., and A. J. Peyton. "Shunt bootstrapping technique to improve bandwidth of transimpedance amplifiers." Electronics Letters 35.5 (1999): 369-370.

Hobbs, Philip CD. "Photodiode front ends: The real story." Optics and Photonics News 12.4 (2001): 44-47.

Miller, R. L. "Fractional-frequency generators utilizing regenerative modulation." Proceedings of the IRE 27.7 (1939): 446-457.

Wilkinson, Ernest J. "An N-way hybrid power divider." IRE Transactions on Microwave Theory and Techniques 8.1 (1960): 116-118.

Mongia, R.K., Bahl, I.J., Bhartia,P., Hong, J., "RF and Microwave Coupled-Line Circuits", Boston: Artech House, Apr. 30, 2007, 574 pages.

Pavlov, Nikolai, G. Mashlum, and Dirk Meier. "Gamma spectroscopy using a silicon photomultiplier and a scintillator." IEEE Nuclear Science Symposium Conference Record, 2005. vol. 1. IEEE, 2005.

Marano, D., et al. "Silicon photomultipliers electrical model extensive analytical analysis." IEEE Transactions on Nuclear Science 61.1 (2014): 23-34.

Seifert, Stefan, et al. "Simulation of silicon photomultiplier signals." IEEE Transactions on Nuclear Science, 56 (6), 2009 (2009).

Rivetti, A., "CMOS Front-End Electronics for Radiation Sensors", ISBN-13: 978-1466563100, CRC Press, 2015, https://www.crcpress.com/CMOS-Front-End-Electronics-for-Radiation-Sensors/Rivetti/p/book/9781466563100 (website printout, 3 pages).

Analog Devices, Inc. data sheet, "AD8352, 2GHz Ultralow Distortion Differential RF/IF Amplifier", 2008, 20 pages.

* cited by examiner

FIG. 5

BOOTSTRAPPING READOUT FOR LARGE TERMINAL CAPACITANCE ANALOG-SIPM BASED TIME-OF-FLIGHT PET DETECTOR

CROSS-REFERENCE TO RELATED APPLICATION

This application claims priority under 35 U.S.C. § 119(e) to U.S. Provisional Application Ser. No. 62/158,108 filed on May 7, 2015, which is hereby incorporated by reference in its entirety.

FIELD

Aspects of the present disclosure relate in general to detectors for nuclear imaging, and more particularly to silicon photomultiplier detectors for time-of-flight nuclear imaging.

BACKGROUND

Time-of-flight (TOF) nuclear imaging, such as TOF positron emission tomography (PET), is used to construct two-dimensional and/or three-dimensional images of structures within a patient. TOF PET (and other TOF nuclear imaging) detects coincidence events representing near simultaneous detection of annihilation photon pairs using a pair of detectors. The TOF PET system determines the difference in time between the detection of the two photons (e.g., the time of flight) and localizes the point of origin of the annihilation event that occurred between the two detectors.

Silicon photomultipliers (SiPM) have been proposed as detectors for use in nuclear imaging, such as in TOF PET. SiPM are single-photon avalanche diode (SPAD) devices connected in an avalanche photodiode array. Analog SiPM (aSiPM) devices intrinsically have a large terminal capacitance, which determines the total input capacitance and large quenching resistance. The quenching resistance is related to input impedance of the analog frontend electronics (AFE) coupled to the aSiPM device. The large terminal capacitance and large input impedance results in a slow time response for aSiPM-based detectors.

SUMMARY

In various embodiments, a system including an analog silicon photomultiplier (aSiPM) is disclosed. The aSiPM detects at least one photon event. The aSiPM includes an anode and a cathode. The system also includes a transformer that has a first side electrically coupled to the aSiPM to form a low-impedance current loop between the anode and the cathode of the aSiPM. An impedance ratio of the transformer reduces an effective terminal resistance of the aSiPM. The system also includes an amplifier electrically coupled to a second side of the transformer. The amplifier has a negative feedback path configured to minimize any voltage swing between a non-inverting input and an inverting input of the amplifier. The negative feedback path reduces an effective terminal capacitance and an effective load impedance of the aSiPM.

In various embodiments, a positron emission topography (PET) imaging system is disclosed. The PET imaging system includes a gantry sized and configured to receive a patient and a scanner including at least one imaging modality configured to detect a plurality of photon events. The at least one imaging modality includes a plurality of detectors. Each of the detectors includes an analog silicon photomultiplier (aSiPM) configured to detect at least one photon event. The aSiPM has an anode and a cathode. Each of the detectors also includes a transformer that has a first side electrically coupled to the aSiPM to form a low-impedance current loop between the anode and the cathode of the aSiPM. An impedance ratio of the transformer reduces an effective terminal resistance of the aSiPM. An amplifier is electrically coupled to a second side of the transformer. The amplifier has negative feedback path configured to minimize the voltage swing between a non-inverting input and an inverting input. The negative feedback reduces an effective terminal capacitance and an effective load impedance of the aSiPM. A computer is in data communication with the first imaging modality and configured to process data for medical imaging.

In various embodiments, a detector circuit is disclosed. The detector circuit includes an analog silicon photomultiplier (aSiPM) configured to detect at least one photon event. The aSiPM has an anode and a cathode. A transformer has a first side electrically coupled to the aSiPM to form a low-impedance current loop between the anode and the cathode of the transformer. An impedance ratio of the transformer reduces an effective terminal resistance of the aSiPM. A transimpedance amplifier is electrically coupled to a second side of the transformer. The transimpedance amplifier has a first feedback resistor coupled between a positive gain adjust input and a positive balanced differential output of the amplifier and a second feedback resistor coupled between a negative gain adjust input and a negative balanced differential output of the amplifier. The negative feedback reduces an effective terminal capacitance and an effective load impedance of the aSiPM.

BRIEF DESCRIPTION OF THE DRAWINGS

The following will be apparent from elements of the figures, which are provided for illustrative purposes and are not necessarily drawn to scale.

DETAILED DESCRIPTION

This description of the exemplary embodiments is intended to be read in connection with the accompanying drawings, which are to be considered part of the entire written description.

Various embodiments of the present disclosure address the foregoing challenges associated with TOF PET using aSiPM based detectors, for example, by coupling the aSiPM to an analog frontend electronic (AFE) in a differential bootstrapping configuration.

Figure 1:
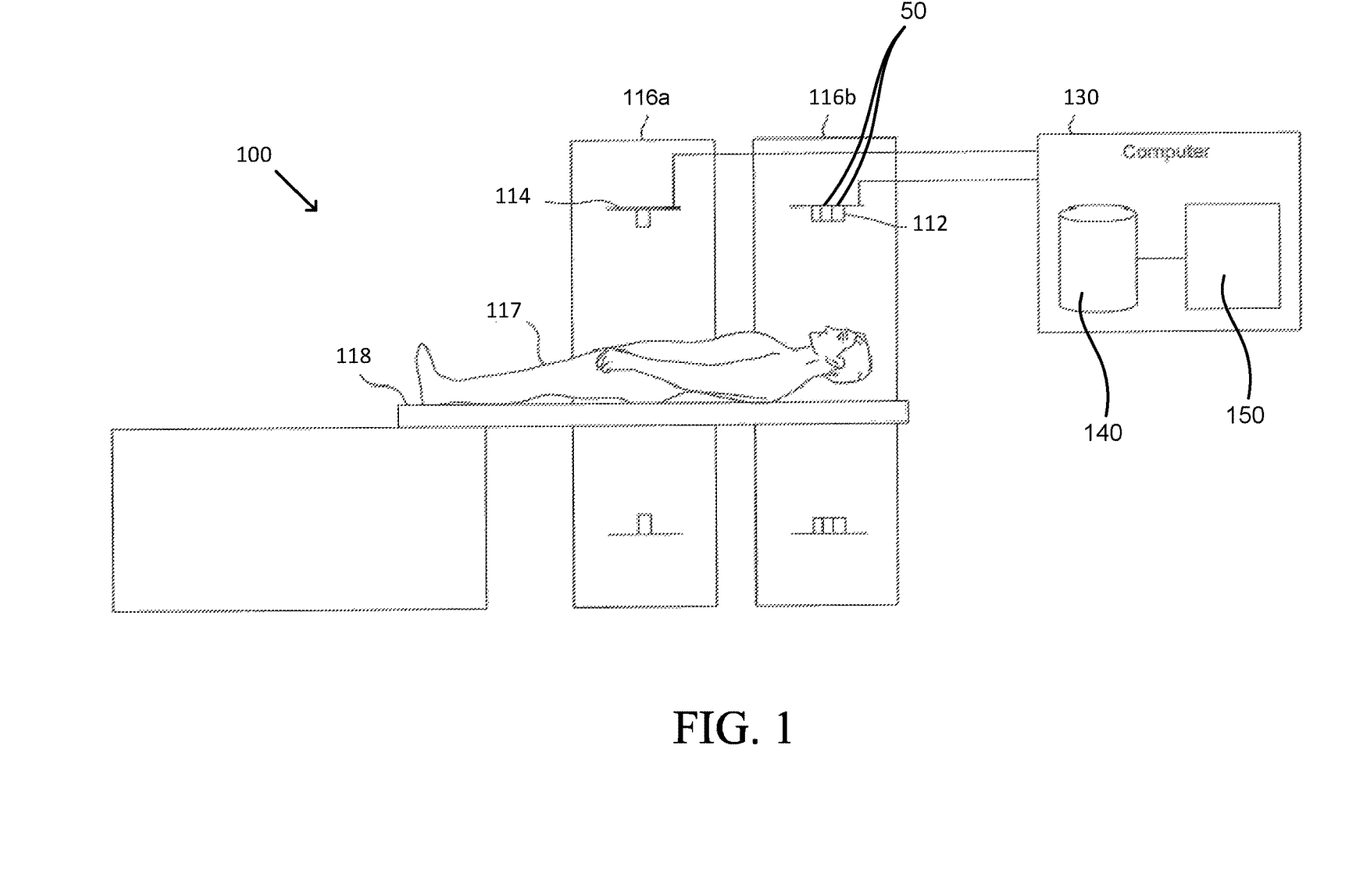
FIG. 1 illustrates a time-of-flight (TOF) positron emission tomography (PET) imaging system, in accordance with some embodiments.

FIG. 1 illustrates one embodiment of a TOF PET detector 100. The TOF PET detector 100 includes a scanner for at least a PET modality 112 provided in a first gantry 116a. The PET modality 112 includes a plurality of detectors 50 configured to detect an annihilation photon, gamma ray, and/or other nuclear imaging event. In various embodiments, the PET modality 112 is TOF PET. A patient 117 lies on a movable patient bed 118 that may be movable between a gantry. In some embodiments, the TOF PET 100 includes a scanner for a second imaging modality 114 provided in a second gantry 116b. The second imaging modality 114 can be any suitable imaging modality, such as, for example, computerized tomography (CT), single-photon emission tomography (SPECT) and/or any other suitable imaging modality.

Scan data from the PET modality 112 is stored at one or more computer databases 140 and processed by one or more computer processors 150 of a computer 130. The graphical depiction of computer 130 in FIG. 1 is provided by way of illustration only, and computer 130 may include one or more separate computing devices. The imaging data sets can be provided by the PET modality 112 and/or may be provided as a separate data set, such as, for example, from a memory coupled to the computer 130.

Figure 2:
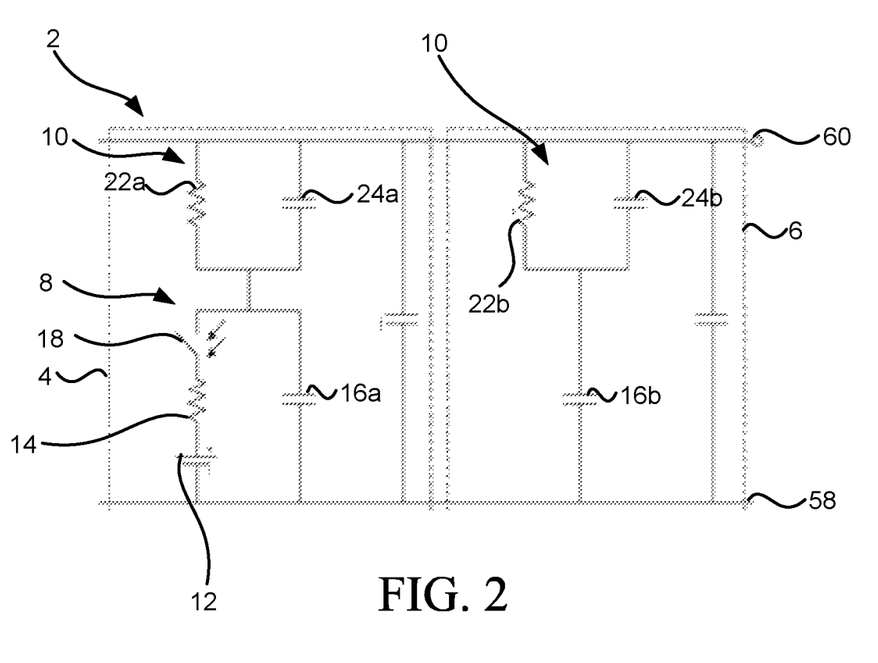
FIG. 2 illustrates an aSiPM microcell, in accordance with some embodiments.

FIG. 2 illustrates a circuit model of an aSiPM microcell 2, in accordance with some embodiments. The aSiPM microcell 2 can be configured as a detector 50 for one or more nuclear imaging modalities 112, 114, such as, for example, a TOF PET imaging modality 112. The aSiPM microcell 2 includes one or more firing cells 4 and one or more passive cells 6. The firing cell 4 is configured to respond to an annihilation photon event, for example, by generating a signal when receiving a gamma ray during a TOF PET scan. The one or more passive cells 6 are configured to avalanche (or cascade) in response to the firing cell 4 to generate a scintillation pulse output at cathode 58 and/or anode 60. The scintillation pulse is provided to analog frontend electronics (AFE) coupled to the aSiPM microcell 2 (see FIG. 3). The scintillation response in a TOF PET detector can be considered a homogeneous single-input, single-output (SISO) system, with a single input of the photo-electron current pulse from the aSiPM microcell 2 and a single output (voltage or current signal) from the AFE.

The firing cell 4 includes a terminal portion 8 configured to respond to an annihilation photon event by initiating a cascade and a quenching portion 10 configured to quench the cascade. The terminal portion 8 is configured to generate a predetermined voltage in response to an annihilation photon event. In some embodiments, the terminal portion 8 is modeled as a voltage source 12 in series with a terminal resistor 14 (which is representative of the terminal resistance value $R_d$) and in parallel with a diode capacitor 16a (which is representative of the diode capacitance value $C_d$). In some embodiments, the voltage source 12 and the terminal resistor 14 are replaced with a current source 12a in parallel with the terminal resistor 14 (see FIG. 3). A switch 18 controls a breakdown response of the firing cell 4 to an annihilation photon event. A breakdown event occurs when the aSiPM microcell 2 receives a gamma ray from an annihilation photon event, causing the firing cell 4 to generate a reverse voltage sufficient to overcome the bias of the aSiPM microcell 2. An open position of the switch 18 corresponds to firing cell 4 being in a forward-bias state and the closed position of the switch 18 corresponds to firing cell 4 being in a reverse-bias, or breakdown, state. The terminal portion 8 is coupled in series to the quenching portion 10. The quenching portion 10 includes a quenching resistor 22a (having a quenching resistance value $R_q$) in parallel with a quenching capacitor 24a (having a quenching capacitance value $C_q$). The quenching portion 10 limits current through the aSiPM microcell 2 and facilitates transition of the terminal portion 8 from an active (or avalanche) state to a pre-charge (or ready) state to allow detection of additional annihilation photon events.

In some embodiments, the firing cell 4 is coupled in parallel to one or more passive cells 6. Each of the passive cells 6 includes a quenching resistor 22b and a quenching capacitor 24b coupled in parallel. The quenching portion 10 of the passive cell 6 is coupled in series to the terminal capacitor 16b. In some embodiments, a plurality of passive cells 6 can be coupled in parallel with the firing cell 4.

In operation, when the aSiPM microcell 2 encounters an annihilation photon event (such as receiving a gamma ray during a PET TOF scan), the firing cell 4 is forward-biased (e.g., the switch 18 is "closed") and the firing cell 4 generates an output signal, causing each of the passive cells 6 to activate in a cascade or avalanche event. The avalanche event produces a predetermined scintillation output signal between the anode 58 and the cathode 60 of the aSiPM microcell 2. The avalanche event is quenched by the respective quenching portions 10 of each of the firing cell 4 and the passive cell 6. When the aSiPM microcell 2 breaks down, e.g., when the firing cell 4 initiates an avalanche event, a large charge is generated by the aSiPM microcell 2. The quenching portion 10 spatially distributes the charge, allowing the aSiPM to recover (e.g., recharge) to detect additional annihilation photon events.

Figure 3:
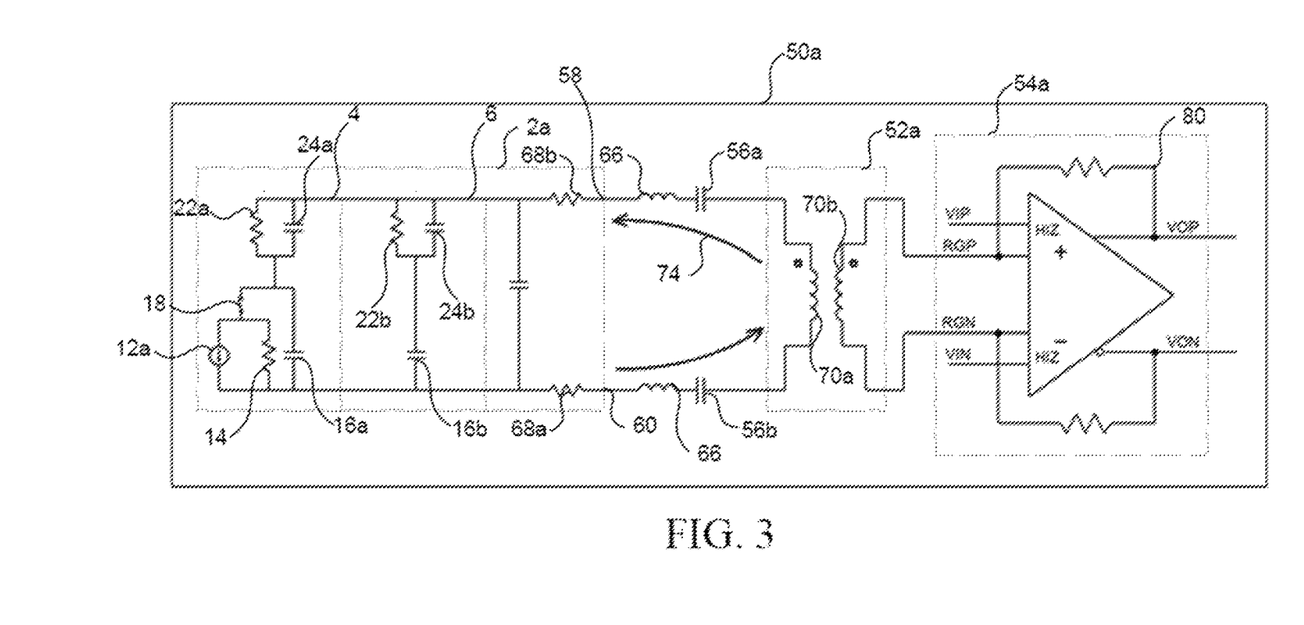
FIG. 3 illustrates a detector circuit having an aSiPM microcell coupled to a radiofrequency (RF) transformer and a current-to-voltage transimpedance amplifier in a differential bootstrapping arrangement, in accordance with some embodiments.
Figure 4:
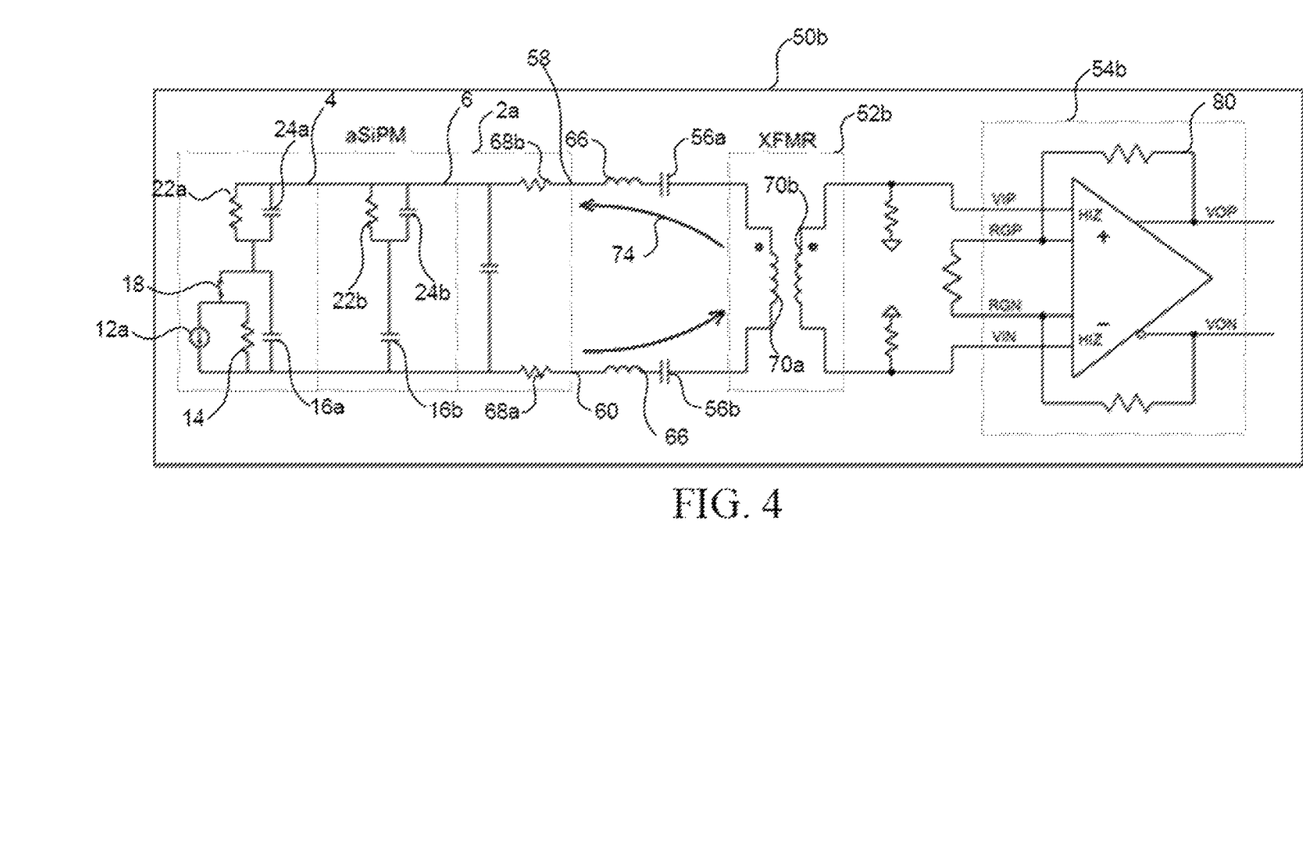
FIG. 4 illustrates a detector circuit having an aSiPM microcell coupled to an RF transformer and a voltage amplifier in a differential bootstrapping arrangement, in accordance with some embodiments.
Figure 5:
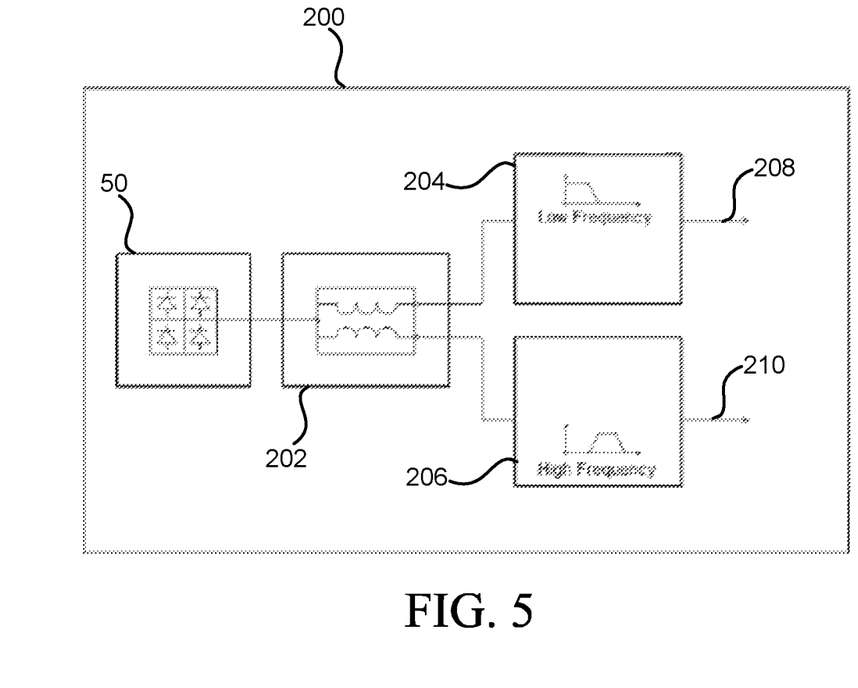
FIG. 5 illustrates a frequency-oriented splitter circuit, in accordance with some embodiments.

In some embodiments, the response rate of the aSiPM microcell 2 is set by a recharge time constant $\tau$. The recharge time constant $\tau$ is determined by one or more parameters of the aSiPM microcell 2. For example, in some embodiments, the recharge time constant $\tau$ is defined by the equation (1):

$$\tau \approx R_q C_d + N R_L C_q \quad (1)$$

when $C_d \gg C_q$ (which is true for must use cases), $R_q$ is the quenching resistance (as represented by the quenching resistors 22a, 22b) $C_d$ is the diode capacitance of the aSiPM microcell 2 (as represented by the diode capacitors 16a, 16b), $C_q$ is the quenching capacitance (as represented by the quenching capacitors 24a, 24b), $R_L$ is the input impedance of analog frontend electronics (AFE) coupled to the aSiPM microcell 2 (see FIG. 3), and N is the total number of microcells 4, 6 in the aSiPM microcell 2. Analog frontend electronics (AFE) include one or more conditioning circuits coupled to the aSiPM microcell 2 and configured to provide an interface between the aSiPM microcell 2 and one or more systems, such as, for example, computer 130. In various embodiments, AFE can include one or more amplifiers (such as operational amplifiers, transimpedance amplifiers, etc.), transformers, and/or other conditioning circuitry. FIGS. 3-5 illustrate various embodiments of AFE coupled to an aSiPM microcell 2. In some embodiments, N is a sufficiently large value such that the value of $N*R_L$ approaches the value of $R_q$.

In some embodiments the response time for the aSiPM microcell 2 is primarily determined by the terminal capacitance $C_T$ and the input impedance of the AFE. The terminal capacitance $C_T$ is intrinsically determined during construction of the aSiPM microcell 2. In some embodiments, the terminal capacitance $C_T$ is defined by the equation (2):

$$C_T \approx N_f(C_{d,N_f} + C_{q,N_f}) + N_f \cdot C_{m,N_f} + N_p \cdot (C_{d,N_p} + C_{q,N_p}) + N_p \cdot C_{m,N_p} \quad (2)$$

wherein $N_f$ is the number of firing cells 4 in the aSiPM microcell 2, $N_p$ is the number of passive cells 6 in the aSiPM microcell 2, and $C_m$ is a material capacitance in each of the firing cells 4 or passive cells 6. The terminal capacitance can be simplified to the equation (3):

$$C_T \approx N \cdot (C_d + C_q) + C_g \quad (3)$$

wherein N is the total number of firing cells 4 and passive cells 6 in the aSiPM microcell 2 and $C_g$ is the total grid capacitance of the aSiPM microcell 2. For example, some embodiments of aSiPM microcell 2 devices have a terminal capacitance $C_T$ of 320 pF for a 3 mm×3 mm (50 um) microcell. Other embodiments of aSiPM microcell 2 devices have a terminal capacitance $C_T$ of 920 pF. The large terminal capacitance values produce slow response times that are insufficient for typical TOF imaging processes. The quenching resistance $R_q$ is related to the input impedance of the AFE and typically has a value of about 500 KΩ. As shown in equation (2) above, the quenching resistor $R_q$ and the input impedance of the AFE affect the pulse shape of the scintillation signal.

For a signal path between an aSiPM and the AFE, the time-resolution of the aSiPM based PET detector is determined by a source capacitance ($C_L$) and the terminal capacitance ($C_T$). The source capacitance $C_L$ is a capacitive value generated by one or more AFE, such as, for example, a transimpedance amplifier 54 (see FIGS. 3 and 4). For example, in an AFE having a transimpedance configuration, the rise-time constant $\tau_R$ of the AFE is defined by the equation (4):

$$\tau_R = \frac{C_T C_L + (C_T + C_L) C_f}{g_{m1} C_f} \quad (4)$$

where $C_f$ is a feedback capacitance of the AFE and $g_{m1}$ is the gain of the amplifier. Although the actual terminal capacitance $C_T$ is determined intrinsically, TOF detector performance can be improved by reducing the effective terminal capacitance $C_T$ and/or reducing the input impedance for the AFE. In some embodiments, the terminal capacitance $C_T$ and/or the input impedance $R_L$ of the AFE are effectively reduced by a differential bootstrapping configuration.

FIG. 3 illustrates a detector circuit 50a including an aSiPM microcell 2a coupled to an RF transformer 52a and a transimpedance amplifier 54a in a differential bootstrapping configuration, in accordance with some embodiments. The aSiPM microcell 2a is similar to the aSiPM 2 described in conjunction with FIG. 2, and similar description is not repeated herein. The detector circuit 50a has a physical capacitance $C_C$ (represented as physical capacitors 56a, 56b) coupled between each of an anode 58 and a cathode 60 of the aSiPM microcell 2a and the input terminals of the RF transformer 52a. Stray inductance $L_S$ from the aSiPM microcell 2a to the RF transformer 52a is represented by inductors 66 and stray resistance is represented by resistors 68a, 68b.

In some embodiments, the physical capacitance $C_C$ is selected to block a high voltage (HV) bias across the aSiPM microcell 2a. In some embodiments, one of the physical capacitors 56a, 56b can be omitted. For example, in embodiments having a positive HV bias across the aSiPM microcell 2a, only the physical capacitor 56a coupled to the cathode 58 may be included. Similarly, in embodiments having a negative HV bias across the aSiPM microcell 2a, only the physical capacitor 56b coupled to the anode 60 may be included.

The connection between the aSiPM microcell 2a, RF transformer 52a, and the transimpedance amplifier 54a effectively reduces the terminal capacitance $C_T$ (e.g., the "source" terminal capacitance effect) and/or the input impedance (e.g., the "load" resistance) of the aSiPM microcell 2a. For example, the aSiPM microcell 2a and the RF transformer 52a are coupled in a closed-loop configuration. The closed-loop provides a low-impedance current loop for current 74. The closed-loop configuration reduces the voltage swing (ΔV), across the aSiPM microcell 2a cathode 58 and anode 60 by limiting the charge/discharge of the terminal capacitance $C_T$. The transimpedance amplifier 54a applies a bootstrap force to the aSiPM microcell 2a through a negative feedback path 80. The negative feedback path 80 minimizes the voltage swing between the non-inverting input (RGP/VIP) and the inverting input (RGN/VIN) of the amplifier 54a, which reduces the effective terminal capacitance $C_T$. The effectively reduced terminal capacitance $C_T$ provides a smaller recharge time constant τ and increases response time of the aSiPM microcell 2a (e.g., T is smaller).

In some embodiments, a high impedance ratio of the RF transformer 52a further reduces the voltage swing across the terminal capacitance $C_T$ of the aSiPM microcell 2a. The RF transformer 52a transforms a signal from a first branch 70a coupled to the aSiPM microcell 2a to a second branch 70b coupled to an amplifier 54a. The impedance ratio of the RF transformer 52a is 1:M, where M can be choses as any suitable conversion factor, such as, for example, 1, 2, 4, 8, and/or any other suitable conversion factor. The conversion factor determines the effective load resistance of the aSiPM microcell 2a. For example, in some embodiments, the conversion factor reduces the load resistance to a value of $R_T$/M, where $R_T$ is the load resistance value of the amplifier 54a.

The transimpedance amplifier 54a can be any suitable transimpedance amplifier, such as a voltage-feedback amplifier (VFA), a current-feedback amplifier (CFA), and/or any other suitable transimpedance amplifier. In some embodiments, the input impedance of a CFA may be effectively lower (e.g., the CFA produces less voltage swing across the terminal capacitance $C_T$) than a VFA, providing an advantage to CFA based circuits, particularly in high frequency ranges. In some embodiments, a VFA allows greater adjustments of the feedback resistors $R_F$, allowing greater adjustment of an I-V gain compared to a CFA. Although certain advantages of the CFA and/or the VFA exist, it will be appreciated that the transimpedance amplifier 54a can be selected to be any suitable amplifier, such as CFA, VFA, and/or other amplifier based on one or more operational requirements. In some embodiments, the transimpedance amplifier 54a can be a commercially available operational amplifier (opamp) such as, for example, an AD8352 op amp, manufactured by Analog Devices of Norwood, Massachusetts. In other embodiments, the transimpedance amplifier can be a dedicated application-specific integrated circuit (ASIC) designed to fit a selected application (such as TOF PET) of the detector 50a.

FIG. 4 illustrates a detector circuit 50b including an aSiPM microcell 2a coupled to an RF transformer 52b and a voltage amplifier 54b. The detector circuit 50b is similar to the detector circuit 50a described in conjunction with FIG. 3, and similar description is not repeated herein. The voltage amplifier 54b has an input impedance RT between the non-inverting input RGP and the inverting input RGN. The input impedance RT and the conversion factor M of the RF transformer 52b determine the effective load resistance of the aSiPM microcell 2a. For example, in embodiments the input impedance RT is 50Ω and the conversion factor M=8, effectively reducing the load resistance of the aSiPM microcell 2a to 50/8, or 6.3Ω.

FIG. 5 illustrates a frequency-oriented scintillation pulse splitter circuit 200, in accordance with some embodiments. The pulse splitter circuit 200 is configured to separate the scintillation signal into two signal paths 208, 210. The pulse splitter circuit 200 includes a frequency splitter 202 having a low-pass component 204 and a high-pass component 206. The low-pass component 204 isolates a low-frequency portion of the scintillation signal and the high-pass component 206 isolates a high-frequency portion of the scintillation signal. The separated high-frequency portion is diverged into the timing signal path 210 used for PET timing pickoff and the low-frequency portion is branched to the energy signal path 208 used for PET energy and event-positioning. The high-frequency portion can be considered "fast" signals in the time domain and the low-frequency portion can be considered "slow" signals in the time domain. Splitting the scintillation signal improves signal chain noise-figure (NF), which is the measure of the signal-to-noise ratio (SNR) degradation from the input, e.g., the scintillation pulse from the detector 50a, 50b, to the output, e.g., the split ends of both the timing 210 and energy paths 208. The pulse splitter circuit 200 allows a TOF PET detector to provide a better timing resolution and a better energy resolution than traditional splitters, such as tee-type splitters.

The apparatuses and processes are not limited to the specific embodiments described herein. In addition, components of each apparatus and each process can be practiced independent and separate from other components and processes described herein.

The previous description of embodiments is provided to enable any person skilled in the art to practice the disclosure. The various modifications to these embodiments will be readily apparent to those skilled in the art, and the generic principles defined herein may be applied to other embodiments without the use of inventive faculty. The present disclosure is not intended to be limited to the embodiments shown herein, but is to be accorded the widest scope consistent with the principles and novel features disclosed herein.

What is claimed is:

1. A system comprising:
an analog silicon photomultiplier (aSiPM) configured to detect at least one photon event, the aSiPM having an anode and a cathode;
a transformer having a first side electrically coupled to the aSiPM to form a low-impedance current loop between the anode and the cathode of the aSiPM, wherein an impedance ratio of the transformer reduces an effective terminal resistance of the aSiPM; and
an amplifier electrically coupled to a second side of the transformer, wherein the amplifier has a negative feedback path configured to minimize any voltage swing between a non-inverting input and an inverting input of the amplifier, and wherein the negative feedback path reduces an effective terminal capacitance and an effective load impedance of the aSiPM.

2. The system of claim 1, wherein the amplifier is a transimpedance amplifier.

3. The system of claim 2, wherein the transimpedance amplifier is coupled to the transformer in a current-to-voltage readout configuration.

4. The system of claim 2, wherein the transimpedance amplifier is coupled to the transformer in a voltage amplification configuration.

5. The system of claim 2, wherein a rise-time constant of the amplifier is determined according to the equation:

$$\tau_R = \frac{C_T C_L + (C_T + C_L) C_f}{g_{m1} C_f}$$

where $C_T$ is a terminal capacitance of the aSiPM, $C_L$ is an input capacitance of the amplifier, $C_f$ is a frequency capacitance, and $g_{m1}$ is a gain of the amplifier.

6. The system of claim 1, wherein the negative feedback path comprises:
a first feedback resistor coupled between a positive gain adjust input and a positive balanced differential output of the amplifier; and
a second feedback resistor coupled between a negative gain adjust input and a negative balanced differential output of the amplifier.

7. The system of claim 1, wherein a recharging phase time-constant of the aSiPM is determined according to the equation:

$$\tau_r \approx R_q C_d + N R_L C_q$$

wherein $R_q$ is a quenching resistance of the aSiPM, $C_d$ is a diode capacitance of the aSiPM, $C_q$ is a quenching capacitance of the aSiPM, N is a total number of firing and passive cells in the aSiPM, and $R_L$ is an input impedance of the amplifier.

8. The system of claim 1, comprising a frequency-oriented splitter circuit coupled to an output of the amplifier, wherein the frequency oriented splitter circuit is configured to split a scintillation output of the amplifier into a high-frequency component and a low-frequency component.

9. The system of claim 8, wherein the frequency-oriented splitter circuit comprises a low-pass filter configured to output the low-frequency component and a high-pass filter configured to output the high-frequency component.

10. The system of claim 8, wherein the high-frequency component is provided as an energy and positioning signal and the low-frequency component is provided as a timing pickoff signal.

11. A positron emission topography (PET) imaging system, comprising:
a gantry sized and configured to receive a patient;
a scanner including at least one imaging modality configured to detect a plurality of photon events, the at least one imaging modality comprising a plurality of detectors, each of the detectors comprising:
an analog silicon photomultiplier (aSiPM) configured to detect at least one photon event, the aSiPM having an anode and a cathode;
a transformer having a first side electrically coupled to the aSiPM to form a low-impedance current loop between the anode and the cathode of the aSiPM, wherein an impedance ratio of the transformer reduces an effective terminal resistance of the aSiPM; and
an amplifier electrically coupled to a second side of the transformer, wherein the amplifier has negative feedback path configured to minimize the voltage swing between a non-inverting input and an inverting input, and wherein the negative feedback reduces an effective terminal capacitance and an effective load impedance of the aSiPM; and
a computer in data communication with the first imaging modality and configured to process data for medical imaging.

12. The PET imaging system of claim 11, wherein the amplifier is a transimpedance amplifier.

13. The PET imaging system of claim 12, wherein a rise-time constant of the amplifier is determined according to the equation:

$$\tau_R = \frac{C_T C_L + (C_T + C_L) C_f}{g_{m1} C_f}$$

where $C_T$ is a terminal capacitance of the aSiPM, $C_L$ is an input capacitance of the amplifier, $C_f$ is a frequency capacitance, and $g_{m1}$ is a gain of the amplifier.

14. The PET imaging system of claim 11, wherein the negative feedback path comprises:
   a first feedback resistor coupled between a positive gain adjust input and a positive balanced differential output of the amplifier; and
   a second feedback resistor coupled between a negative gain adjust input and a negative balanced differential output of the amplifier.

15. The PET imaging system of claim 11, wherein a recharging phase time-constant of the aSiPM is determined according to the equation: $\tau_r \approx R_q C_d + N R_L C_q$ wherein $R_q$ is a quenching resistance of the aSiPM, $C_d$ is a diode capacitance of the aSiPM, $C_q$ is a quenching capacitance of the aSiPM, N is a number of microcells in the aSiPM, and $R_L$ is an input impedance of the amplifier.

16. The PET imaging system of claim 11, wherein the scanner further comprises a frequency-oriented splitter circuit coupled to an output of the amplifier, wherein the frequency oriented splitter circuit is configured to split a scintillation output of the amplifier into a high-frequency component and a low-frequency component.

17. The PET imaging system of claim 16, wherein the frequency-oriented splitter circuit comprises a low-pass filter configured to output the low-frequency component and a high-pass filter configured to output the high-frequency component.

18. The system of claim 16, wherein the high-frequency component is provided as an energy and positioning signal to the computer and the low-frequency component is provided as a timing pickoff signal to the computer.

19. A detector circuit comprising:
   an analog silicon photomultiplier (aSiPM) configured to detect at least one photon event, the aSiPM having an anode and a cathode;
   a transformer having a first side electrically coupled to the aSiPM to form a low-impedance current loop between the anode and the cathode of the transformer, wherein an impedance ratio of the transformer reduces an effective terminal resistance of the aSiPM; and
   a transimpedance amplifier electrically coupled to a second side of the transformer, wherein the transimpedance amplifier has a first feedback resistor coupled between a positive gain adjust input and a positive balanced differential output of the amplifier and a second feedback resistor coupled between a negative gain adjust input and a negative balanced differential output of the amplifier, and wherein the negative feedback reduces an effective terminal capacitance and an effective load impedance of the aSiPM.

20. The detector circuit of claim 19, wherein a first terminal of the transformer is coupled to a positive balanced differential input of the transimpedance amplifier and a second terminal of the transformer is coupled to a negative balanced differential input of the transimpedance amplifier.

* * * * *